US006655022B1

(12) United States Patent
Eskildsen et al.

(10) Patent No.: US 6,655,022 B1
(45) Date of Patent: *Dec. 2, 2003

(54) IMPLEMENTING MICRO BGA ASSEMBLY TECHNIQUES FOR SMALL DIE

(75) Inventors: Steven R. Eskildsen, Folsom, CA (US); Richard B. Foehringer, Shingle Springs, CA (US); Deborah S. Kaller, Auburn, CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/160,535

(22) Filed: Sep. 24, 1998

(51) Int. Cl.$^7$ .............................. H05K 3/28; H05K 3/34; H01R 43/00
(52) U.S. Cl. .............................. 29/841; 29/827; 29/832; 438/111; 438/112; 438/126; 438/127; 257/778; 257/779; 257/791
(58) Field of Search .............................. 29/827, 825, 830, 29/831, 832, 841; 257/791, 777, 778, 779; 438/126, 127, 111, 112; 427/96

(56) References Cited

U.S. PATENT DOCUMENTS

| 5,321,333 A | * | 6/1994 | Walden et al. .............. 310/328 |
| 5,506,756 A | | 4/1996 | Haley |
| 5,519,580 A | | 5/1996 | Natarajan et al. |
| 5,521,420 A | | 5/1996 | Richards et al. |
| 5,557,149 A | | 9/1996 | Richards et al. |
| 5,585,668 A | * | 12/1996 | Burns ........................ 257/676 |
| 5,663,106 A | | 9/1997 | Karavakis et al. |
| 5,776,796 A | * | 7/1998 | Distefano et al. ....... 438/112 X |
| 5,878,942 A | * | 3/1999 | Kodama et al. ........ 228/180.22 |
| 5,894,410 A | | 4/1999 | Barrow |
| 5,910,687 A | | 6/1999 | Chen et al. |
| 5,972,738 A | | 10/1999 | Vongfuangfoo et al. .... 438/124 |
| 5,985,695 A | | 11/1999 | Freyman et al. ............ 438/112 |
| 6,011,304 A | | 1/2000 | Mertol ........................ 257/706 |
| 6,127,726 A | | 10/2000 | Bright et al. ............... 257/691 |
| 6,172,419 B1 | | 1/2001 | Kinsman |
| 6,201,301 B1 | | 3/2001 | Hoang ........................ 257/712 |

FOREIGN PATENT DOCUMENTS

JP  55-124241  *  9/1980  .................. 29/827

OTHER PUBLICATIONS

Amagai et al, "Development of Chip Scale Packages (CSP) for Center Pad Devices", IEEE Proceedings, Electronic Componen and Technology Conference, May 1997, pp. 343–352.*

"The Micro Ball Grid Array (μBGA) Package", Intel Corporation, *1998 Packaging Databook*, Chapter 15, Jan. 1998, pp. 15–1 to 15–8.

"The μBGA Package: Intel's Latest Flash Memory Packaging Innovation", Intel Corporation, downloaded from http://developer.intel.com/design/flcomp/PACKDATA/UBGABACK.HTM on Sep. 3, 1998, 4 pages.

(List continued on next page.)

*Primary Examiner*—A. Dexter Tugbang
(74) *Attorney, Agent, or Firm*—Peter Lam

(57) ABSTRACT

A method of implementing a micro BGA is introduced. More specifically, the method discloses packaging an integrated circuit into an integrated circuit assembly. The method first mounts polyimide tape to a lead frame. The polyimide tape serves as a substrate for the integrated circuit package. Next, a piece of elastomer is coupled to said polyimide tape. Then an integrated circuit die is attached to said elastomer. Lead beams are then bonded from bond pads on said die to said lead frame. Solder balls are attached to said lead frame. The attached solder balls may be located beyond the area of said die.

11 Claims, 8 Drawing Sheets

OTHER PUBLICATIONS

"The AMD Fine-pitch Ball Grid Array (FBGA) for Flash Memory", AMD Corporation, downloaded from http://www.amd.com/products/nvd/overview/21616.html, updated Jun. 30, 1998, 3 pages.

"Chip-Scale Packaging for AMD Flash Memory Products", AMD Corporation, downloaded from http://www.amd.com/products/nvd/technology/21627.pdf., Jun. 30, 1998, 5 pages.

"μBGA Cross Section", Tessera, Inc., downloaded from http://www.tessera.com/technology/corss.htm on Aug. 28, 1998, 1 page.

"Tessera μBGA™ Package Construction", Tessera, Inc. downloaded from http://www.tessera.com/technology.construct.htm on Aug. 28, 1998, 1 page.

"μBGA™ Design Process", Tessera, Inc., downloaded from http://www.tessera.com/technology/p-design.htm on Aug. 28, 1998, 1 page.

"Micro BGA Assembly Process", Tessera, Inc. downloaded from http://www.tesera.com/technology/prodmod.htm on Aug. 29, 1998, 1 page.

"μBGA Reliability", Tessera, Inc. downloaded from http://www.tessera.com/technology/CSPTMS-2.HTM on Aug. 28, 1998, 5 pages.

"Array Density and Circuit Routing Guidelines for μBGA™ Packages, Application Note 8", Tessera, Inc., downloaded from http://www.tessera.com/whatsnew/ap10-96a.htm, Oct. 1996, 3 pages.

"μBGA Reliability", Tessera, Inc., downloaded from http://www.tessera.com/technology/reliab2.htm on Aug. 28, 1998, 1 page.

"PLUS CODE 83 IS NOT DEFINEDBGA Technology Comparison", Tessera, Inc., downloaded from http://www.tessera.com/technology/p-compar.htm on Aug. 28, 1998, 1 page.

* cited by examiner

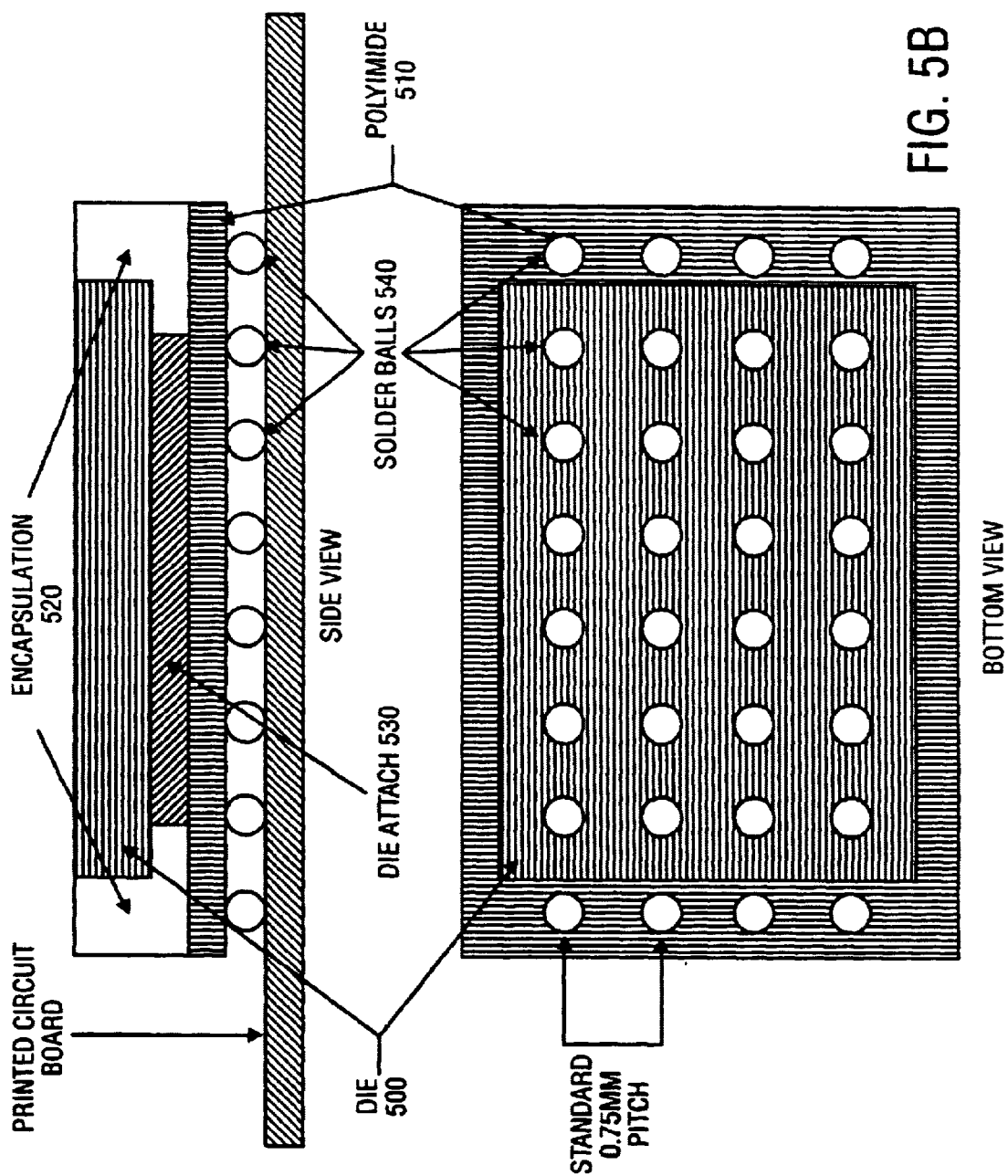

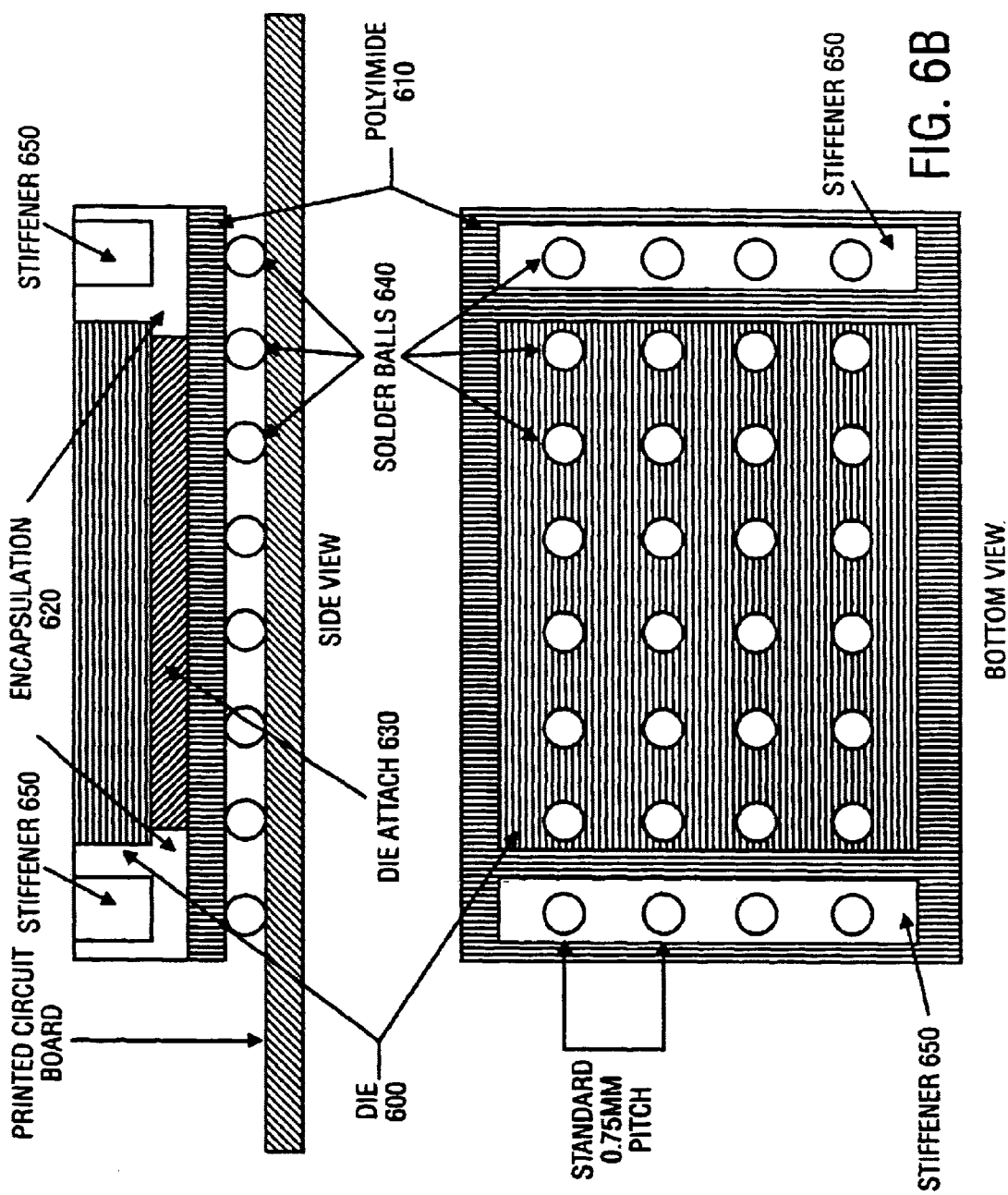

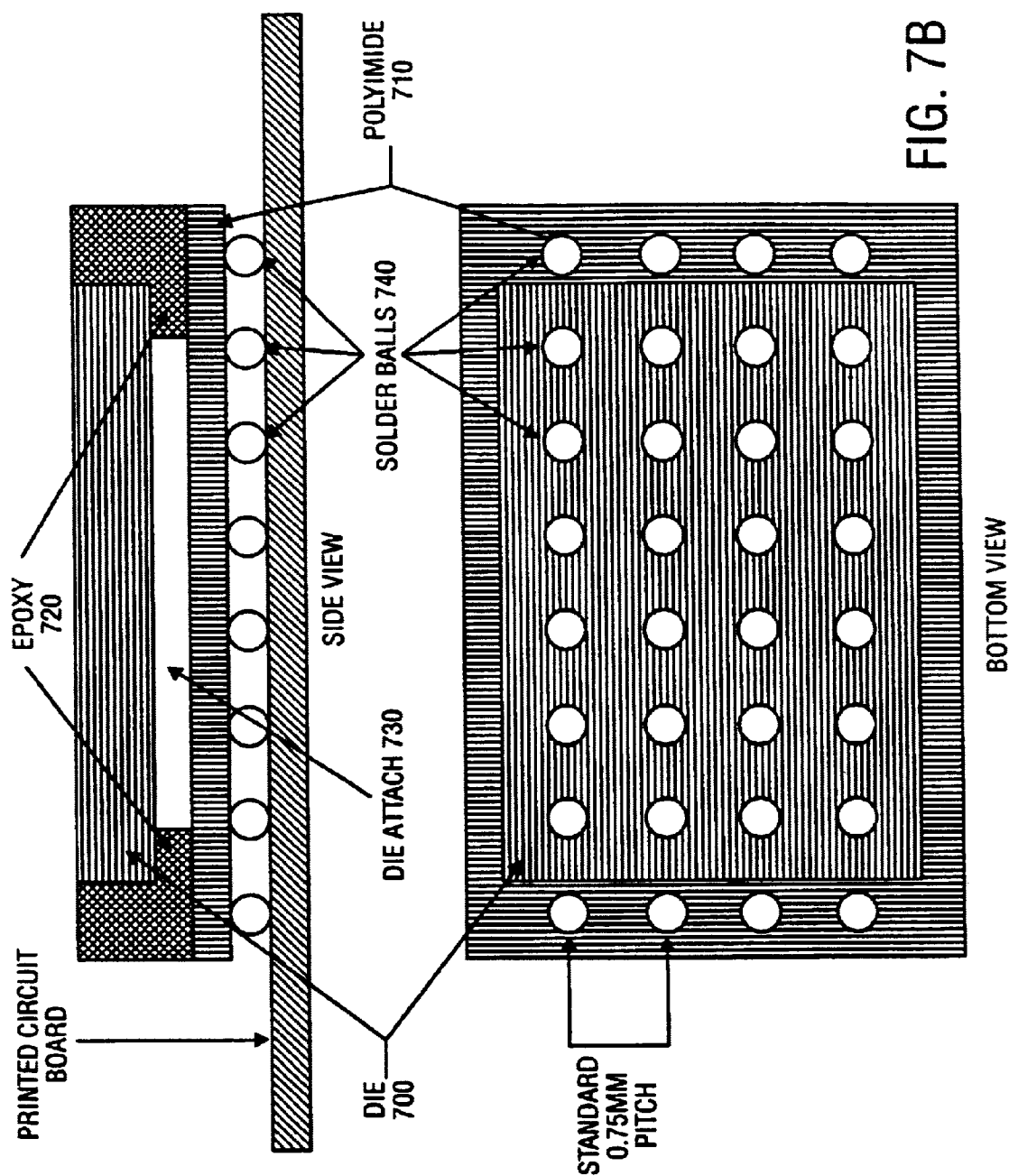

IMPLEMENTING MICRO BGA ASSEMBLY TECHNIQUES FOR SMALL DIE

BACKGROUND OF THE INVENTION

1. Field of the Invention

This invention relates to a package for an integrated circuit. More particularly, the present invention relates to a method of implementing micro BGA™.

2. Description of Related Art

As semiconductor devices become more and more complex, electronics designers are challenged to fully harness their computing power. Some of today's products can feature millions of transistors and device count is expected to continue increasing in the future. With a greater number of functions integrated on a die or chip of silicon, manufacturers and users face new and increasingly challenging electrical interconnect issues. To tap the power of the die efficiently, each level of electrical interconnect from the die to the functional hardware or equipment must also keep pace with these revolutionary devices.

Today, sub-micron feature size at the die level is driving package feature size down to the design rule level of the early silicon transistors. At the same time, electronic equipment designers are shrinking their products, increasing complexity, and setting higher expectations for performance. In order to meet these demands, package technology must deliver higher lead counts, reduced pitch, reduced footprint area, and significant overall volume reduction. Package technology has responded to these challenges with a number of concept changes and improvements. For instance, in response to the need for increasing number of leads or pins required for packages, ball grid array interconnects have been used to increase the density of contacts. This approach has not only helped to control package size, but also to enhance electrical performance by reducing trace length.

Integrated circuits (IC) are typically housed within a package that is mounted to a printed circuit board. The package has conductive leads or pins that are soldered to the printed circuit board and coupled to the integrated circuit by a lead frame. One kind of package commonly referred to as a ball grid array (BGA) is an integrated circuit package which has a plurality of solder balls that interconnect the package to a printed circuit board. The solder balls are attached to a polyimide based flexible circuit board which has a number of conductive traces and accompanying solder pads. The integrated circuit die is connected to the solder pads of the flexible circuit by wire bonds and electrically coupled to the solder balls through conductive traces routed across the flexible circuit.

However, customers in applications such as handheld communications such as cellular phones, Personal Communications Service (PCS) pagers, computing, PCMCIA (Personal Computer Memory Card International Association) I/O cards, and other small form factor system have different miniaturization goals and needs. Fit, form, and function tend to be market specific. In addition, IC manufacturers have recognized that existing surface-mount packages such as the Thin Small Outline Package (TSOP) do not take full advantage of the semiconductor process lithography improvements that were driving smaller integrated circuit die sizes. The die cost typically has the most impact on the total manufacturing cost. In order to drive down the cost of the final product, semiconductor manufacturers continually migrate to state-of-the-art processes to reduce die size.

Another type of integrated circuit package is the micro ball grid array™ ($\mu$BGA™) package. $\mu$BGA is a registered trademark of Tessera, Inc. of San Jose, Calif. The $\mu$BGA package enables IC manufactures to respond to customer needs for smaller and thinner components. The $\mu$BGA package is considered a chip size package (CSP). A chip size package is generally defined as a package which does not exceed the die size by greater than 20%. However, the $\mu$BGA package does not allow a smaller die to be placed in the same package without affecting package dimensions. Hence, smaller die generally result in a smaller $\mu$BGA package and usually a finer ball pitch. Since the package size and pitch change with die size, semiconductor manufacturers and customers may need to retool handling and testing equipment each time the die size changes due to die shrinks. Furthermore, the smaller solder ball pitch may require more complicated and expensive printed circuit board technologies and surface mount technologies.

Hence it would therefore be desirable to have a package and method for producing a $\mu$BGA package which has a uniform size regardless of the size of the die contained in the package.

SUMMARY OF THE INVENTION

The present invention introduces a method of implementing micro BGA. More specifically, the present invention discloses a method of packaging an integrated circuit into an integrated circuit assembly. The method of the present invention first mounts polyimide tape to a lead frame. The polyimide tape serves as a substrate for the integrated circuit package. Next, a piece of elastomer is coupled to said polyimide tape. Then an integrated circuit die is attached to said elastomer. Lead beams are then bonded from bond pads on said die to said lead frame. Solder balls are attached to said lead frame. The attached solder balls may be located beyond the area of said die.

Other objects, features, and advantages of the present invention will be apparent from the accompanying drawings and from the detailed description that follows.

BRIEF DESCRIPTION OF THE DRAWINGS

The present invention is illustrated by way of example and not limitations in the figures of the accompanying drawings in which like references indicate similar elements, and in which:

FIG. 3b illustrates a side view of FIG. 3a;

FIG. 3c illustrates a bottom view of FIG. 3a;

FIG. 4b illustrates a zoomed in view of one area of FIG. 4a;

FIG. 5a illustrates a side view of a small die $\mu$BGA package implementing one embodiment of the present invention;

FIG. 5b illustrates a bottom view of FIG. 5a;

FIG. 6a illustrates a side view of a small die $\mu$BGA package utilizing stiffeners in another embodiment of the present invention;

FIG. 6b illustrates a bottom view of FIG. 6a;

FIG. 7a illustrates a side view of a small die μBGA package utilizing an epoxy in yet another embodiment of the present invention; and FIG. 7b illustrates a bottom view of FIG. 7a.

DETAILED DESCRIPTION OF THE INVENTION

Figure 1:
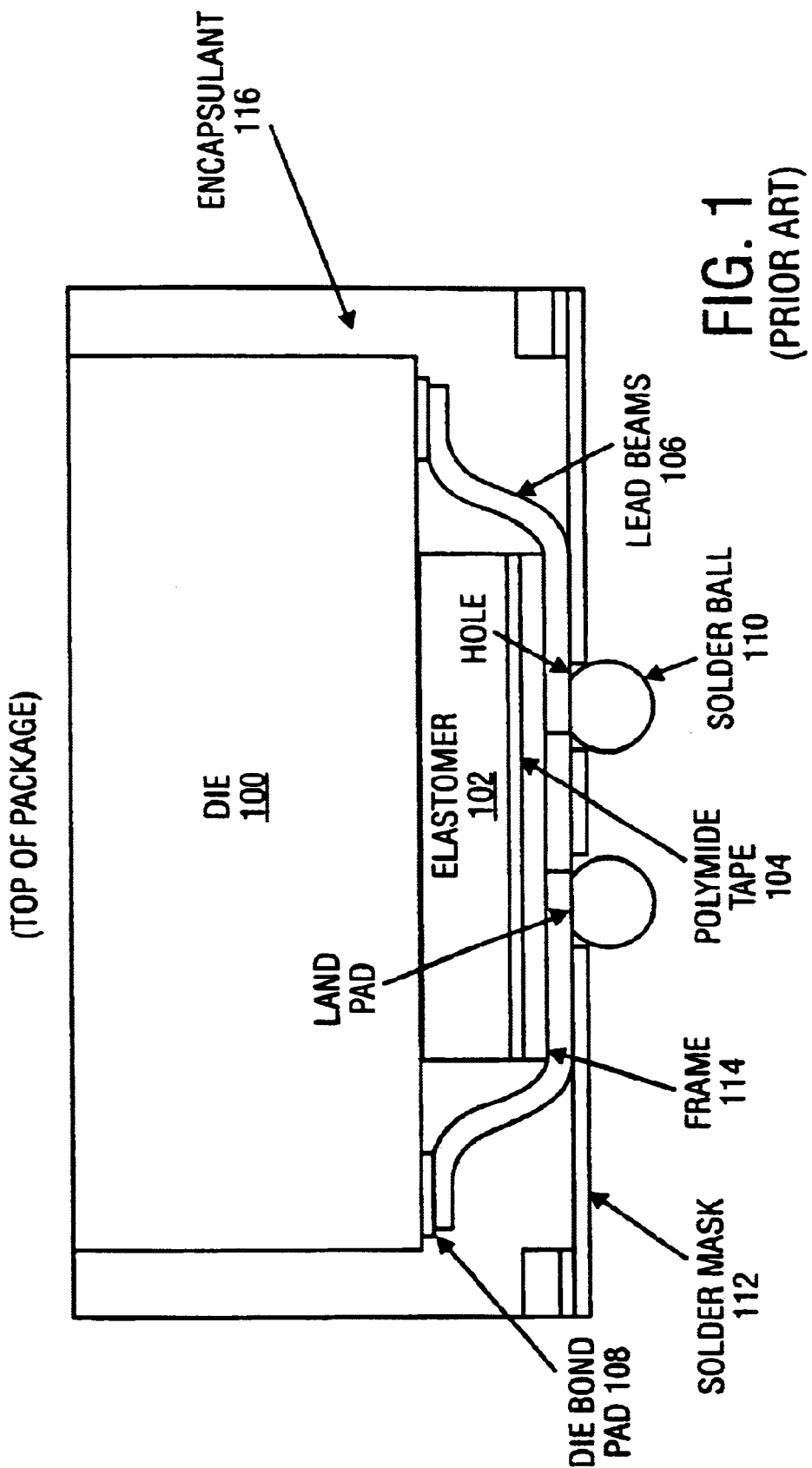
FIG. 1 illustrates a detailed cross-section and construction of a $\mu$BGA package.

A method of implementing μBGA is disclosed. In the following description, for purposes of explanation, specific nomenclature is set forth to provide a thorough understanding of the present invention. However, it will be apparent to one skilled in the art that these specific details are not required in order to practice the present invention. For example, the present invention has been described with reference to flash memory. Although the following embodiments are described with reference to flash memory components, other embodiments are applicable to other types of integrated circuits that are packaged. The same techniques and teachings of the present invention can easily be applied to other types of integrated circuits.

The Micro BGA Package

The micro ball grid array (μBGA) package is considered a chip size package (CSP). A chip size package is generally defined as a package which does not exceed the die size by greater than 20%. However, chip size packages are die size dependent and may vary in width and length in accordance with different integrated circuit dies. μBGA is easier to use than other CSP alternatives. For example, easy board assembly, temperature cycle tolerance, no underfill, solder joint reliability, and moisture resistance. Furthermore, the μBGA may be used with today's printed circuit board (PCB) surface mount device assembly processes.

Certain factors that may be considered in developing and deploying the μBGA package include the following. First, the package has to match or exceed both a customer's quality and reliability expectations and the excellent quality and reliability levels associated with existing smallest package option, the TSOP. Second, the package should leverage the current investment that customers have made in both PCB technology and board assembly equipment. In addition, the potential of the package type being an industry-wide solution should be considered. Third, the package deployment schedule may need to meet or exceed a customer's time frame expectations for this type of solution. Fourth, the cost of assembling the package in the future may need to meet cost expectations. This factor includes the ability to cost reduce and be competitive, if not superior to other solutions. Fifth, as an additional factor in total cost, the cost of deploying the package in a manufacturer's assembly and test facilities may be examined.

A μBGA package is comprised of an individual product die, a layer of compliant elastomer, and a flexible polyimide tape interconnect. Furthermore, the μBGA package is constructed on the die itself. A tape containing wire interconnects is attached to the die and wire traces are bonded directly to the die. In existing μBGA packages, the maximum package size is normally determined by the die size. Therefore, the ball grid array is constrained by the die size. Because of the configuration of the flexible polyimide tape and the compliant elastomer material, the μBGA package exhibits improved coefficient of thermal expansion (CTE) compliant properties. Any associated lead beam stresses resulting from the CTE are dissipated via the elastomer encapsulation. Lacking leads, the μBGA package has reduced coplanarity and handling issues.

Referring now to FIG. 1, it illustrates a detailed cross-section and construction of a μBGA package. Starting at the top of the package is the integrated circuit die 100. Depending on the integrated circuit manufacturer and the application, the die may be a flash memory chip, embedded controller, processor, or some other kind of integrated circuit device. The die 100 is coupled to an elastomer 102. The μBGA package's compliant elastomer 102 relieves stress that may be caused by thermal coefficient of expansion mismatches between the silicon die 100 and the PCB. The release of stress is very important when one considers that many applications for this type of package include portable communications and computing systems, which by their very nature, will be operated in a variety of environments and with less than optimal end-user handling characteristics. Coupled to the elastomer 102 is polyimide tape 104. Polyimide is a synthetic polymeric resin of a class resistant to high temperatures, wear, and corrosion, used mainly as a film or coating on a substrate substance. The polyimide tape 104 here serves as a substrate for the package. Attached to the polyimide tape 104 is a lead frame 114, which has conductive lead beams 106 that are electrically connected to bond pads 108 on the die 100. The other end of the lead beams 106 are coupled to solder landings on the bottom of the package. At least a portion of the periphery of the chip is encapsulated with an encapsulation material 116 so as to encapsulate the bonded leads 106. The bottom surface of the package is covered with a solder mask 112. The solder mask 112 has a plurality of openings that expose solder landings. During assembly of the package, a plurality of solder balls 110 are placed into the solder mask openings onto the solder landings. A solder flux is typically applied to the solder landings prior to the placement of the solder balls 110 into the openings.

Attached to each solder landing is a ball of solder that is subsequently reflowed. The solder balls are typically attached to the package by placing hard solder balls through the solder mask holes onto the solder ball lands and then reflowing the solder. The solder balls reharden as a sphere that are attached to the landings. To prevent the solder from flowing to a adjacent soldering landing and shorting the package, a solder mask is typically applied to the bottom package surface. The solder mask has a plurality of openings that are concentric with the solder landings and allow the solder balls to be attached to the package.

Figure 2:
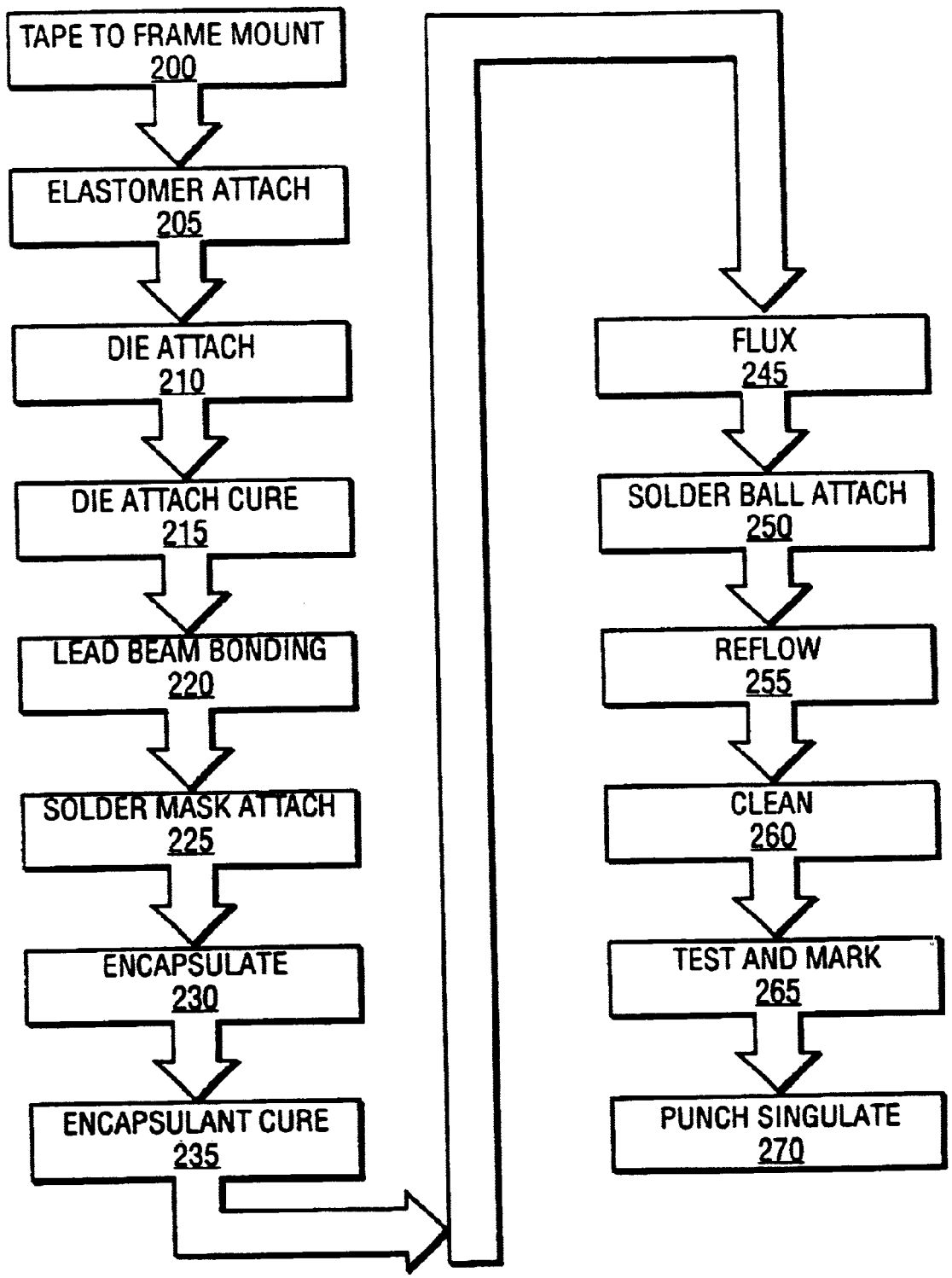
FIG. 2 is a flow chart illustrating the steps of one method for assembling a $\mu$BGA package.

FIGS. 1 and 2 will be referenced in describing some of the steps in the manufacturing process of a μBGA package. FIG. 2 is a flow chart illustrating the steps of one method for assembling a μBGA package. Initially at step 200, polyimide tape 104 is mounted to a lead frame 114. Then at step 205, elastomer 102 is attached to the polyimide tape 104. The die 100 is attached to the elastomer 102 at step 210. The die attach is cured at step 215. At step 220, lead beams 106 are bonded to their respective bond pads 108 or chip contacts. A solder mask lay is attached to this assembly at step 225 to mask out certain areas for encapsulation. The periphery of the die 100, elastomer 102, polyimide tape 104, and frame 114 are encapsulated at step 230 such that the lead beams are encapsulated and protected. Then the encapsulant 116 is cured at step 235. Solder flux is applied to the solder landings at step 245 and before solder ball placement at 250. The solder balls 110 are reflowed at step 255 and allowed to harden. The package is cleaned at step 260 before being tested and marked at step 265. Individual μBGA packages are singulated at step 270 from other μBGA packages that are attached to the same substrate. This step is performed because in some manufacturing processes, multiple dies 100 are packaged on a large piece of substrate concurrently.

The μBGA package also features self aligning characteristics during the reflow process. The solder balls are self centering within certain limits during reflow, thus reducing placement problems during surface mount. Handling problems associated with fragile or bent leads are also absent. The 0.75 mm ball pitch provides a transition to current industry standard PCB design and assembly surface mount technology (SMT) processes, allowing tolerances for more reliable surface mounting. A thin profile and reduced footprint also contribute to the μBGA package's use in products where circuit board space availability is of major concern.

Smallest Package Size

The μBGA package is a true die-sized package and may be useful for space constrained applications. For instance, the μBGA package is perfect for small form factor commercial applications such as digital cellular phones, personal information devices, and wireless communications devices. The μBGA package offers the smallest integrated circuit package footprint available and has excellent solder joint reliability characteristics. In addition, the matrix of solder balls for mounting the component to the PCB allows for routing to occur underneath the package using standard PCB trace/space design rules. Thus, the total footprint for the package on the board is as small or smaller than any other CSP available. A μBGA package needs only about one-third the PC board space of current TSOP packages.

Figure 3A:
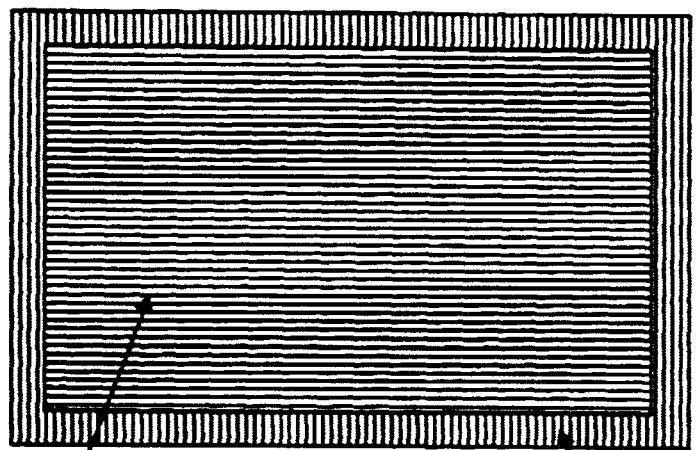
FIG. 3a illustrates a top view of a $\mu$BGA package which may utilize the present invention.
Figure 3B:
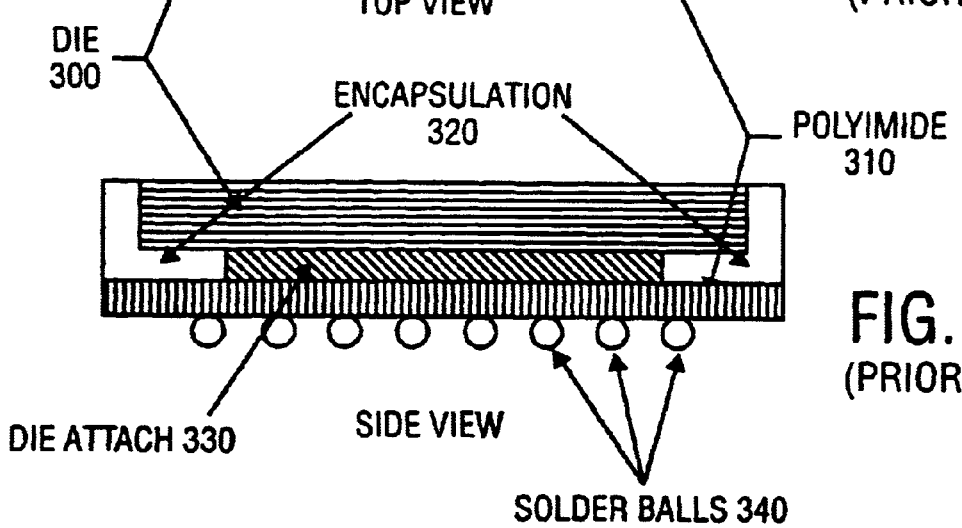
Figure 3C:
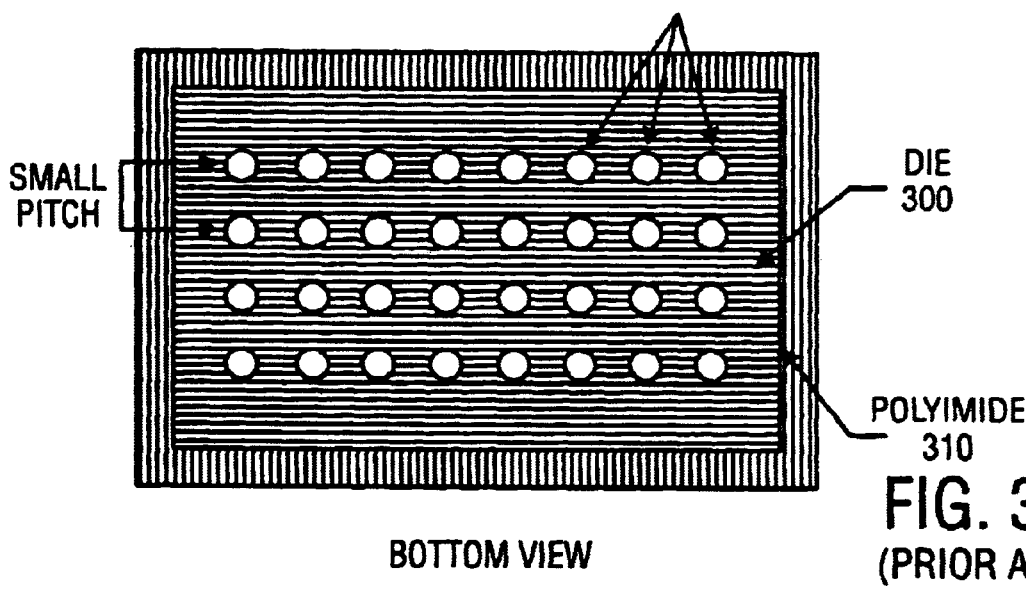

FIGS. 3a, 3b, and 3c illustrates different views of one embodiment of a current μBGA package. FIG. 3a illustrates a top view of a current μBGA package. FIG. 3b illustrates a side view of FIG. 3a. FIG. 3c illustrates a bottom view of FIG. 3a. From the top view in FIG. 3a, the die 300 is shown to be covering a large portion of the package's surface area. This μBGA package has a die 300 coupled to one surface of a die attach 330. Similarly, the second surface of the die attach 330 is coupled to a substrate made of polyimide tape 310. The periphery of the die 300 and die attach 330 are encapsulated by an encapsulation material 320 as illustrated in FIG. 3b. The bottom view FIG. 3c shows the array of solder balls 340 arranged in a 4×8 matrix with small pitch. In current designs, the solder balls 340 are attached to the bottom of the μBGA package such that all the solder balls 340 reside within the area covered by the die 300. As a result, the pitch of the solder balls 340 become smaller and smaller as the size of the die 300 and corresponding surface area for attaching solder balls 340 shrink.

High Quality and Reliability for Portable Environments

One factor that may be considered when contemplating bringing a new package to production is its quality and reliability potential. A major area of focus is the solder joint reliability of the package/board system. The μBGA package's compliant elastomer relieves the stress caused by thermal coefficient of expansion mismatches between the silicon die and the PCB, thus providing reliable long-term solder joint integrity. Such reliability may be important when one considers that many applications for this package include portable communications and computing systems. By their very nature, these systems will be operated in a variety of hostile environments and with less-than-optimal end user handling characteristics. Another factor considered regarding quality is the customers' PCB assembly failure rate expectations. μBGA type packages intrinsically have self-aligning qualities during soldering, which equate to lower assembly defects. μBGA packages are also leadless, again simplifying handling requirements and optimizing yield.

Impact of Technology Migrations

There are numerous costs associated with the manufacture of a semiconductor device: die cost, assembly cost, test cost, finishing costs. The die cost typically has the greatest impact on the total manufacturing cost. In order to drive down the cost of the final product, semiconductor manufacturers continually migrate to state-of-the-art processes to reduce die size. For instance, the optimum distance between balls on a μBGA, the ball pitch, is determined by the OEM's PC board technology and system routing complexity. Because flash memories require a low ball count, devices with ball pitches of 0.75 mm can be easily routed with today's most widely used and most cost effective PC board technology. Although projections indicate that in 2000 and beyond, 0.5 mm ball pitches may be economically feasible, these finer pitch devices currently add to both board and manufacturing and design costs.

However, as lower cost die are packaged in μBGA package dimensions are affected by changes in die size. Constant footprint and package size changes may occur when die revisions occur. Smaller die result in a smaller μBGA package and usually a finer ball pitch. It may not be possible to handle the new μBGA packages with standard SMT manufacturing equipment or process. Therefore, manufacturing line changes may be required to implement different μBGA packages into a new design. In addition, since the μBGA package is a chip scale form factor or die-sized package, lower density flash memories and small integrated circuits often do not have enough die area to place or locate a usable ball grid array on a die-sized package or work with pick-and-place equipment because of their smaller die size. Using today's most economical 0.35 micron technology, only 8 megabit flash devices and above can be assembled in μBGAs.

As a result, it is useful for manufacturers and their customers to have a WBGA package that will integrate into their presently installed surface mount assembly capability with little or no incremental learning curve, process changes, or equipment investments. Therefore, a method of implementing μBGA with small die using standard manufacturing methods would be desirable.

The present invention may provide time-to-market and cost savings to both IC manufacturers and their customers. Product manufactures may not need to re-layout a board, retool a programmer, or revise an assembly line every time a package's size, footprint, or pin-out changes because of a die revision. Furthermore, system manufacturers using the present invention can benefit from product improvements without having to retool a production line or redesign a PC board constantly. Once a design specifies a μBGA package, future performance and cost improvements in the integrated circuit die can be fully implemented and passed on without affecting package footprint or size.

The present invention allows die shrinks to be implemented with the associated cost reductions without impacting the package body size or ball pitch. Since the package remains unchanged, a semiconductor manufacturer may not need not retool handling and testing equipment each time the die size, and corresponding μBGA package size, changes due to die shrinks. Product manufacturers using the μBGA package may not have to re-layout a board, retool a programmer, or revise and assembly line because of a die revision. Because the present invention allows μBGA packages to be transparent to die shrinks, the system manufacturer can maintain the same programming and manufacturing equipment, processes, and documentation. In addition, the μBGA packages may not need to be re-qualified and thus production lines will not be interrupted. Hence, less costly die can be utilized and infrastructure retooling costs can be eliminated. Furthermore, a long-term guaranteed supply of spare parts assures that systems can be maintained indefinitely in the field. The present invention also allows customers to decide whether to migrate to new, smaller μBGA packages as new improvements in integrated circuit technology occur or to continue using existing μBGA packages, but with a new die packaged within. Hence, smaller packages with finer ball pitches can be provided as die sizes shrink at the option and convenience of the user.

As described above in FIGS. 3a, 3b, and 3c, current implementations of small die μBGA rely on reducing the distance or pitch between solder balls as die size shrinks. However, every time the die size changes, the smaller pitch solder balls arrays also change and require redesign work. Typically, customer solutions which have smaller die use solder ball arrays with smaller pitches. The smaller solder ball pitch requires more complicated and expensive printed circuit board technologies and surface mount technologies. One possible advantage of this invention is that smaller die can be placed in μBGA packages with larger solder ball pitch arrays so that customers may continue to use current processes and technologies without spending significant sums of money in order to use new parts. Since the present invention allows a μBGA package's dimensions to be transparent to die shrinks, the resulting μBGA package is factory friendly and provides assurance of continued availability of compatible components at the lowest possible cost of ownership. Another possible advantage of the present invention is that manufacturers can use current technology and design rules for manufacture of the μBGA tape itself. This prevents increased costs in producing product piece parts associated with using a smaller pitch solder ball array design. Again, this may result in lower cost for customers.

In the present invention, the distance or pitch between solder balls is held constant and the μBGA package dimensions are transparent to die shrinks. Hence, the present invention may be used on products where the integrated circuit die has reduced in size so much that it does not cover all of the solder balls in the solder ball array. This invention also allows manufacturers and customers to continue using current manufacturing processes, materials, and fixture designs while manufacturing advanced integrated circuit designs and technologies. Examples of such fixtures include hand socket, burn-in board sockets, programmer sockets, and handler test site designs. An example of similar process and materials include μBGA tape design (metal trace pitch, and copper traces), printed circuit boards, and surface mount processes.

Figure 4A:
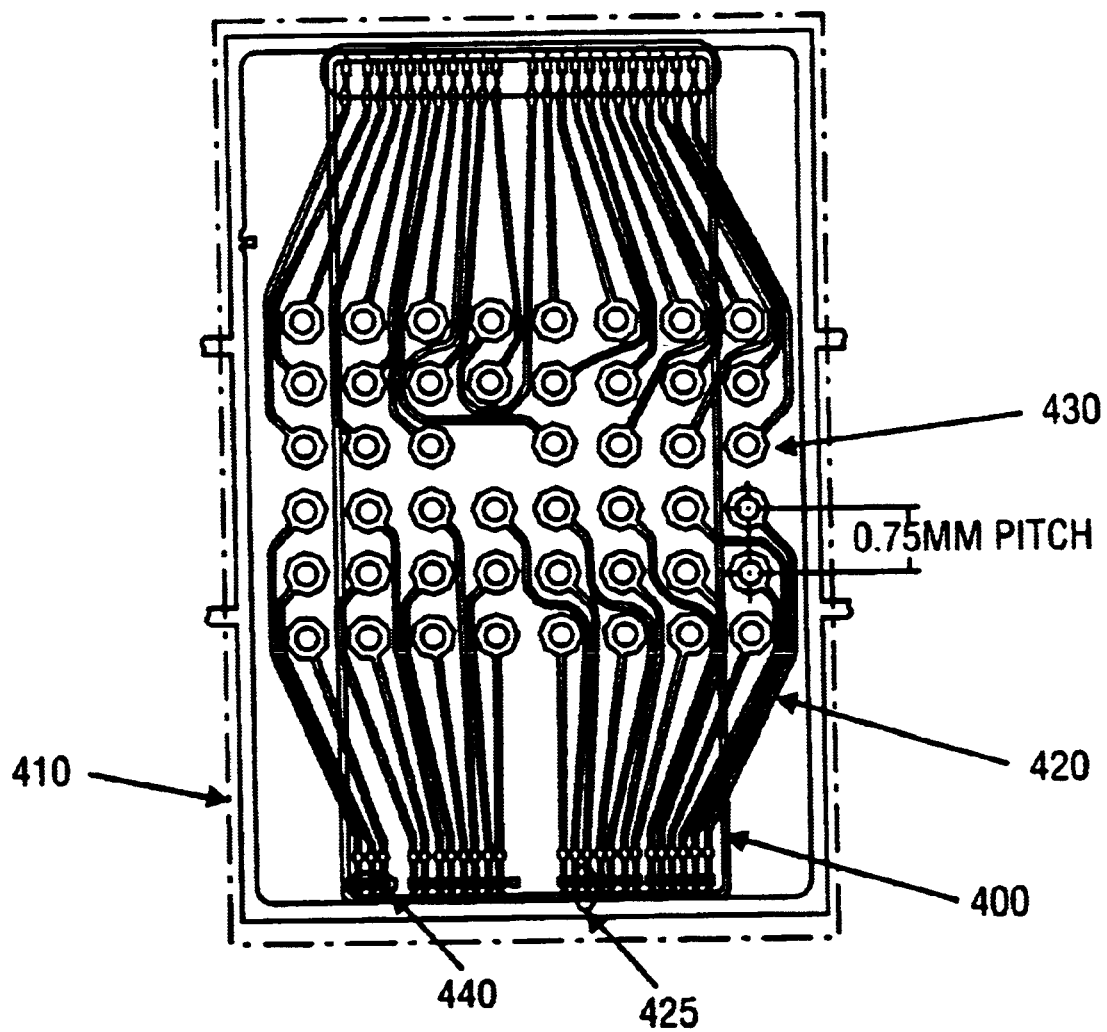
FIG. 4a illustrates a bottom view of a $\mu$BGA package utilizing the present invention being assembled.
Figure 4B:
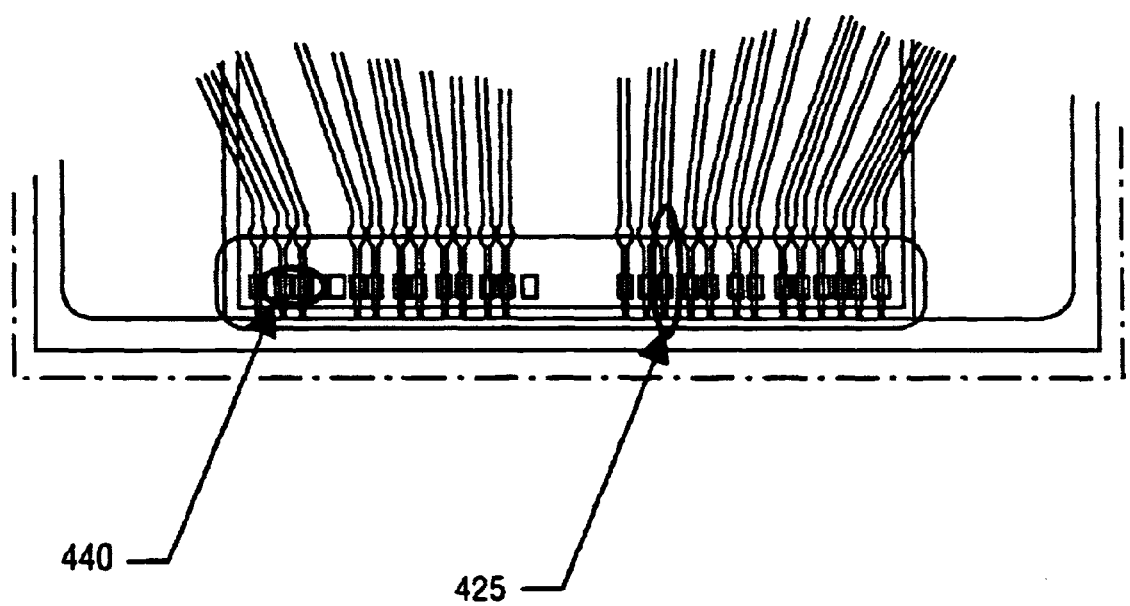

FIGS. 4a, 4b, 5a, and 5b illustrate a first embodiment of the present invention. Referring first to FIG. 4a, there is an illustration of the bottom view of one embodiment of a partially complete μBGA package utilizing the current invention. The die 400 is shown as the smaller rectangle within the outer rectangular area representing polyimide tape 410. Also diagrammed are lead traces 420. At the end of the lead traces 420 are lead beams 425 of which the ends are coupled to bond pads 440, while the other end of the lead traces 420 are coupled to solder landings 430. FIG. 4b illustrates a zoomed in view of the area including some lead beams 425 and bond pads 440 of FIG. 4a. Each solder landing is eventually attached with a solder ball. The solder balls are used to solder and attach the μBGA package to a circuit board. The package shown in FIG. 4 has a 6×8 matrix of solder balls and a ball pitch of 0.75 mm. Furthermore, the first and last column of solder landings 430 are located beyond the area covered by the die 400, unlike current μBGA packages. Currently, all the solder landings 430 and solder balls are located within the area encompassed by the die 400.

Normally in μBGA packaging, the silicon die serves as a stiffener for the package and the array of solder balls. The solder balls are normally covered entirely by the silicon die in existing μBGA packages. The present invention introduces a method of overhanging portions of the solder ball array beyond the surface area of the integrated circuit die. Overhang occurs when solder balls are positioned outside of the surface area of the die. The present invention allows manufacturers to use smaller die that do not cover the entire array of solder balls. The solder balls that are not covered by the silicon die area are instead covered by the polyimide tape and encapsulation material.

FIG. 5a illustrates a side view of a small die μBGA package implementing a first embodiment of the present invention. FIG. 5b illustrates a bottom view of FIG. 5a. As similarly described above, the side view in FIG. 5a illustrates a μBGA package that has a die 500 coupled to one surface of a die attach 530. The second surface of the die attach 530 is coupled to a substrate made of polyimide tape 510. Meanwhile, the periphery of the die 500, lead beams, and die attach 530 are encapsulated by an encapsulation material 520. The bottom view FIG. 5b shows the array of solder balls 540 arranged in a 4×8 matrix with 0.75 mm pitch. Not all of the solder balls 540 are attached to the bottom of the μBGA package such that all the solder balls 540 reside within the area covered by the die 500. The first and last column of solder balls 540 are attached to the polyimide tape substrate 510 and outside of the surface area covered by the integrated circuit die 500. Because the solder balls 540 are not restricted to the surface area covered by the die 500, the pitch of the solder balls 540 can remain 0.75 mm even as the die size shrinks.

In a second embodiment of the present invention, additional piece parts may be added into the encapsulation material as needed in order to perform the stiffening function of the silicon die. The addition of piece parts may be performed when the die is so small that the encapsulation material does not provide enough stiffening for the μBGA package. In the present method, the pitch between solder balls is held constant. Furthermore, piece parts are added into the encapsulation that performs a similar stiffening function that a larger die would typically do. This embodiment of the present invention may be used on products where the integrated circuit die has been reduced in size so much that it does not cover all of the solder balls in the solder ball array and attempts to use only the encapsulation for stiffening purposes do not work. With the exception of the additional stiffener piece parts, this embodiment of the present invention allows manufacturers to continue with similar processes, materials, and fixture designs while designing and manufacturing new components.

FIGS. 6a and 6b illustrate a second embodiment of the present invention. FIG. 6a illustrates a side view of a small die μBGA package utilizing stiffeners in another embodiment of the present invention. FIG. 6b illustrates a bottom view of FIG. 6a. As similarly described above, the side view in FIG. 6a illustrates a μBGA package that has a die 600 coupled to one surface of a die attach 630. The second surface of the die attach 630 is coupled to a substrate made of polyimide tape 610. Meanwhile, the periphery of the die 600, lead beams, and die attach 630 are encapsulated by an encapsulation material 620. Piece parts are added into the encapsulation material as stiffeners 650 that perform a stiffening function similar to that of a larger die. The bottom view FIG. 6b shows the array of solder balls 640 arranged in a 4×8 matrix with 0.75 mm pitch. Not all of the solder balls 640 are attached to the bottom of the μBGA package such that all the solder balls 640 reside within the area covered by the die 600. The first and last column of solder balls 640 are attached to the polyimide tape substrate 610 and outside of the surface area covered by the integrated circuit die 600. Because the solder balls 640 are not restricted to the surface area covered by the die 600, the pitch of the solder balls 640 can remain 0.75 mm even as the die size shrinks.

In a third embodiment of the present invention, the encapsulation and added piece parts may be replaced with epoxy. The epoxy adheres to the die and performs as a stiffener similar to the encapsulation and piece parts of the second embodiment. The epoxy firmly attaches to the sides and periphery of the die. This third method may perform better if the epoxy is stiffer than the above encapsulation material. If piece parts are also used in the package as stiffeners, some flex may exist at the point between the die and the stiffening piece part because of a discontinuous stiffening effect. The epoxy may minimize the discontinuity in stiffness between the die and the added stiffeners. Furthermore, this embodiment of the present invention may allow further cost savings if stiffener piece parts are not part of the bill of materials.

In the present method, the pitch between solder balls is held constant. Furthermore, the encapsulation material surrounding the periphery of the die is replaced with epoxy. This embodiment of the present invention may be used where the die has been reduced in size so much that it does not cover all of the solder balls in the solder ball array and previous plans to use only the encapsulation for stiffening purposes does not work. With the exception of replacing an encapsulation step with epoxy, this embodiment of the present invention will allow manufacturers to continue with similar processes, materials, and fixture designs while designing and manufacturing new component.

FIGS. 7a and 7b illustrate a third embodiment of the present invention. FIG. 7a illustrates a side view of a small die μBGA package utilizing an epoxy for encapsulating the μBGA package. FIG. 7b illustrates a bottom view of FIG. 7a. As similarly described above, the side view in FIG. 7a illustrates a μBGA package that has a die 700 coupled to one surface of a die attach 730. The second surface of the die attach 730 is coupled to a substrate made of polyimide tape 710. Meanwhile, the periphery of the die 700, lead beams, and die attach 730 are encapsulated by an epoxy material 720. The bottom view FIG. 7b shows the array of solder balls 740 arranged in a 4×8 matrix with 0.75 mm pitch. Not all of the solder balls 740 are attached to the bottom of the μBGA package such that all the solder balls 740 reside within the area covered by the die 700. The first and last column of solder balls 740 are attached to the polyimide tape substrate 710 and outside of the surface area covered by the integrated circuit die 700. Because the solder balls 740 are not restricted to the surface area covered by the die 700, the pitch of the solder balls 740 can remain 0.75 mm even as the die size shrinks.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded as illustrative than a restrictive sense.

What is claimed is:

1. A method of packaging an integrated circuit into an integrated circuit assembly, said method comprising:

mounting flexible polyimide tape to a lead frame, wherein said flexible polyimide tape serves as a substrate of a micro BGA package;

coupling elastomer to said flexible polyimide tape;

attaching a die to said elastomer;

bonding lead beams from bond pads on said die to said lead frame;

attaching a solder mask to said lead frame, said solder mask having a plurality of solder mask openings to expose solder landings on said lead frame, said solder mask having a larger size than said die wherein length and width dimensions of said solder mask extend beyond length and width dimensions of said die;

encapsulating a periphery of said die, said lead beams, and said solder mask with an encapsulation material, wherein a plurality of stiffener piece parts are added to said encapsulation material beyond said periphery of said die, said stiffener piece parts to provide a stiffening function for said micro BGA package; and attaching solder balls to solder landings coupled on said lead frame, said solder balls arranged in a ball grid array wherein at least one of said attached solder balls is located beyond surface area of said die in a horizontal direction such that said attached solder balls overhang area of said die.

2. The method of claim 1 further comprising covering said integrated circuit assembly with the encapsulation material.

3. The method of claim 2 wherein said assembly comprises of lead beams, die attach, and edges of said die.

4. The method of claim 1 further comprising:

reflowing said integrated circuit assembly; and cleaning said integrated circuit assembly.

5. The method of claim 1 further comprising singulating said integrated circuit assembly from said substrate.

6. The method of claim 2 further comprising curing the encapsulated integrated circuit assembly.

7. The method of claim 1 wherein said attaching solder balls to said lead frame further comprises of fluxing attachment sites on said lead frame.

8. The method of claim 1 wherein said solder balls in said ball grid array have a 0.75 millimeter pitch.

9. The method of claim 1 further comprising the step of covering said integrated circuit assembly with epoxy, said epoxy functioning as a stiffener.

10. The method the claim 9 wherein said assembly comprises of lead beams, die attach, and edges of said die.

11. The method of claim 1 wherein said die is a flash memory.

* * * * *